(12) United States Patent
Kim et al.

(10) Patent No.: US 8,716,920 B2
(45) Date of Patent: May 6, 2014

(54) ELECTRIC ENERGY GENERATING DEVICE AND METHOD OF DRIVING THE SAME

(75) Inventors: Hyun-jin Kim, Seongnam-si (KR); Sung-min Kim, Seoul (KR); Jong-jin Park, Hwaseong-si (KR); Hyung-bin Son, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 124 days.

(21) Appl. No.: 13/487,607

(22) Filed: Jun. 4, 2012

(65) Prior Publication Data

US 2013/0020909 A1    Jan. 24, 2013

(30) Foreign Application Priority Data

Jul. 20, 2011    (KR) .................. 10-2011-0072075

(51) Int. Cl.
*H01L 41/08*    (2006.01)

(52) U.S. Cl.
USPC .......................... 310/328; 310/800

(58) Field of Classification Search
USPC ................................. 310/328, 800
See application file for complete search history.

(56) References Cited

U.S. PATENT DOCUMENTS

| | | | |
|---|---|---|---|
| 6,447,887 B1 | 9/2002 | Claus et al. | |
| 7,151,837 B2 * | 12/2006 | Bank et al. | 381/190 |
| 7,276,137 B2 | 10/2007 | Best et al. | |
| 7,331,245 B2 * | 2/2008 | Nishimura et al. | 73/862.046 |
| 8,265,287 B2 * | 9/2012 | Kageyama | 381/59 |
| 8,385,586 B2 * | 2/2013 | Liou et al. | 381/431 |
| 8,503,702 B2 * | 8/2013 | Kao et al. | 381/191 |
| 2010/0258160 A1 | 10/2010 | Wang et al. | |

FOREIGN PATENT DOCUMENTS

JP    2002-203996 A    7/2002

OTHER PUBLICATIONS

Wang, Z. L., "Towards Self-Powered Nanosystems: From Nanogenerators to Nanopiezotronics", Adv. Funct. Mater. 2008, 18, 3553-3567.
Sun, C. et al., "Fundamental study of mechanical energy harvesting using piezoelectric nanostructures", Journal of Applied Physics 108, 034309, 2010.
Manekkathodi, A. et al., "Direct Growth of Aligned Zinc Oxide Nanorods on Paper Substrates for Low-Cost Flexible Electronics", Adv. Mater. 2010, 22, 4059-4063.
Hur, S. et al., "Power generation using piezoelectric ZnO nanowires for nano-scale devices", Proceedings of 10th IEEE International Conference on Nanotechnology Joint Symposium with Nano Korea 2010, Aug. 17-20, KINTEX, Korea, pp. 763-767.
Choi, J.H. et al., "Power Generating Characteristics of Zinc Oxide Nanorods Grown on a Flexible Substrate by a Hydrothermal Method", Journal of Electrical Engineering & Technology vol. 5, No. 4, pp. 640-645, 2010.

(Continued)

*Primary Examiner* — Mark Budd
(74) *Attorney, Agent, or Firm* — Harness, Dickey & Pierce, P.L.C.

(57) ABSTRACT

An electric energy generating device. The electric energy generating device includes a piezoelectric structure including a material having piezoelectric characteristics, and an insulating film including a material having electret characteristics. When external energy is supplied to the insulating film, the insulating film contacts the piezoelectric structure and the piezoelectric structure is then deformed to generate electric energy. Also, electric energy is generated when an electrostatic capacitance between the insulating film and a substrate adjacent to the insulating film changes.

42 Claims, 17 Drawing Sheets

(56) References Cited

OTHER PUBLICATIONS

Wang, X., "Multifunctional ZnO nanostructures: from material growth to novel applications", Proc. of SPIE vol. 7940, 2011.

Qin, Y. et al., "Microfibre-nanowire hybrid structure for energy scavenging", nature, vol. 451, Feb. 14, 2008.

Choi, M.Y. et al., "Mechanically Powered Transparent Flexible Charge-Generating Nanodevices with Piezoelectric ZnO Nanorods", Adv. Mater. 2009, 21, 2185-2189.

Xu, S. et al., "Self-powered nanowire devices", nature nanotechnology, vol. 5, May 2010, pp. 366-373.

* cited by examiner

ELECTRIC ENERGY GENERATING DEVICE AND METHOD OF DRIVING THE SAME

CROSS-REFERENCE TO RELATED APPLICATIONS

This application claims priority under 35 U.S.C. §1.19 to Korean Patent Application No. 10-2011-0072075, filed on Jul. 20, 2011, in the Korean Intellectual Property Office, the disclosure of which is incorporated herein in its entirety by reference.

BACKGROUND

1. Field

Example embodiments relate to electric energy generating devices, and for example, to an electric energy generating device including a piezoelectric structure and an insulating film having electret characteristics, and/or a method of driving the same.

2. Description of the Related Art

Research has been conducted into electric energy generating devices that convert various types of energies, including mechanical energy, which are generated in an ordinary living environment, into electrical energies by using piezoelectric nano wires grown on a substrate. Electric energy generating devices may include piezoelectric nano wires on a flat bulk type substrate. However, when such an electric energy generating device is used, it is difficult to efficiently generate electric energy from low intensity energy, e.g., low intensity external vibrations or sound waves, due to the bulk type substrate. Thus, research on electric energy generating devices that generate electric energy from mechanical energy generated, e.g., from a motion of a human body, or vibration energy generated, e.g., from external noise, by using a textile having flexible and stretchable characteristics, e.g., clothing, as a substrate is being done. When an electric energy generating device using a textile substrate is used, a piezoelectric effect may be enhanced and an output voltage generated may be efficiently increased, since the textile substrate has improved conformal coverage and a rough surface, and vibrates sensitively in response to an external environment.

SUMMARY

Example embodiments relate to electric energy generating devices including a piezoelectric structure and an insulating film having electret characteristics, and methods of driving the same.

According to example embodiments, an electric energy generating device includes a first substrate over a second substrate, a piezoelectric structure on the first substrate, the piezoelectric structure including a material having piezoelectric characteristics, and an insulating film between the piezoelectric structure and the second substrate. The insulating film includes a material having electret characteristics. The first and second substrates are spaced apart from each and each include a conductive material.

The insulating film is configured to contact and deform the piezoelectric structure when an external mechanical force is applied to the insulating film. The piezoelectric structure is configured to generate electric energy when deformed.

The insulating film may include a material having semi-permanent polarization or semi-permanent surface charges. The insulating film may include a polymer-based material or an inorganic material.

The polymer-based material may include at least one of fluoropolymers, polyethylene (PE), polypropylene (PP), polyethylene terephtalate (PET), polyimide (PI), polymethylmethacrylate (PMMA), polyvinylylidenefluoride (PVDF), ethylene vinyl acetate (EVA), cellular polypropylene, and porous polytetrafluoroethylene (PTFE). The inorganic material may include at least one a silicon oxide, a silicon nitride, an aluminum oxide, and a photorefractive material.

The piezoelectric structure may include an n type semiconductor material, and a surface of the insulating film facing the piezoelectric structure may include (−) surface charges. Alternatively, the piezoelectric structure may include a p type semiconductor material, and a surface of the insulating film facing the piezoelectric structure may include (+) surface charges.

The piezoelectric structure may include one of a piezoelectric material layer on the first substrate and a plurality of piezoelectric nano wires on the first substrate.

The plurality of piezoelectric nano wires may be one of perpendicular to the first substrate and inclined to the first substrate. The plurality of piezoelectric nano wires may include diameters that are one of uniform in a lengthwise direction of the nano wires and gradually changing in the lengthwise direction of the nano wires. The plurality of piezoelectric nano wires may include one of ZnO, lead zirconium titanate (PZT) and $BaTiO_3$.

The piezoelectric material layer may include a polymer piezoelectric film. The polymer piezoelectric film may include polyvinylidene fluoride (PVDF).

Each of the first and second substrates may include a textile substrate. The textile substrate may include a non-conductive textile and a conductive layer on the non-conductive textile. The textile substrate may include a conductive textile.

According to example embodiments, an electric energy generating device includes a piezoelectric structure including a material having piezoelectric characteristics, and an insulating film including a material having electret characteristics. The piezoelectric structure is configured to generate electricity when deformed. The insulating film is configured to contact and deform the piezoelectric structure.

The piezoelectric structure and the insulating film may be between the first and second substrates. Each substrate may include a conductive material. The piezoelectric structure may be on the first substrate, and the insulating film may be between the piezoelectric structure and the second substrate.

According to example embodiments, a method of driving an electric energy generating device including a piezoelectric structure including a material having piezoelectric characteristics and an insulating film including a material having electret characteristics, includes generating electric energy by contacting the insulating film with the piezoelectric structure to deform the piezoelectric structure.

When an external mechanical force is applied to the insulating film, the insulating film may contact the piezoelectric structure.

According to example embodiments, an electric energy generating device includes a first substrate adjacent to a second substrate, a first piezoelectric structure on one of the first second substrates, and an insulating film between the first piezoelectric structure and the other of the first and second substrate. The first and second substrates are apart from each other and each include a conductive material. The first piezoelectric structure includes a material having piezoelectric characteristics.

The insulating film may include at least one of a polymer-based material and an inorganic material.

The first piezoelectric structure may include one of nano wires, nano tubes, nano particles, nano belts, nano cones, micro wires, micro tubes, micro particles, micro belts, and micro cones.

The first piezoelectric structure may include one a piezoelectric material layer and a plurality of piezoelectric nano wires.

The first piezoelectric structure may include the plurality of piezoelectric nano wires and the plurality of nano wires may include an aspect ratio of about 3 to about 10.

The plurality of piezoelectric nano wires may be one of perpendicular to and inclined to the one of the first and second substrates.

The first piezoelectric structure may include an n-type semiconductor material, and a surface of the insulating film facing the piezoelectric structure may include (−) surface charges.

The first piezoelectric structure may include a p-type semiconductor material, and a surface of the insulating film facing the piezoelectric structure may include (+) surface charges.

The electric energy generating device may further include a second piezoelectric structure on one of the first substrate and the second substrate. The second piezoelectric structure may include a material having piezoelectric characteristics.

The first piezoelectric structure may include a plurality of first nano wires, and the second piezoelectric structure may include a plurality of second nano wires.

The plurality of first nano wires and the plurality of second nano wires may be on the first substrate. A piezoelectric material of the first nano wires may be different than a piezoelectric material of the second nano wires. The insulating layer may be between the second substrate and both of the first and second nano wires.

The plurality of first nano wires may be on the first substrate. The plurality of second nano wires may be on the second substrate. The plurality of first nano wires may include one of an n-type semiconductor and a p-type semiconductor. The plurality of second nano wires may include the other of the n-type semiconductor and the p-type semiconductor.

The electric energy generating device may further include a third piezoelectric structure on one of the first substrate and the second substrate. The third piezoelectric structure may include a material having piezoelectric characteristics.

The first piezoelectric structure may be on the first substrate. The insulating film may surround the first substrate and the first piezoelectric structure. The second substrate may surround the insulating film.

According to example embodiments, a phone includes a housing, a circuit in the housing, a microphone connected to the circuit, a speaker connected to the circuit, and at least one of the electric energy generating devices connected to the circuit.

According to example embodiments, a wall system includes at least one of the foregoing electric energy generating devices.

BRIEF DESCRIPTION OF THE DRAWINGS

These and/or other aspects will become apparent and more readily appreciated from the following description of non-limiting embodiments, taken in conjunction with the accompanying drawings in which like reference characters refer to the same parts throughout the different views. The drawings are not necessarily to scale, emphasis instead being placed upon illustrating the principles of example embodiments. In the drawings.

DETAILED DESCRIPTION

Figure 1A:
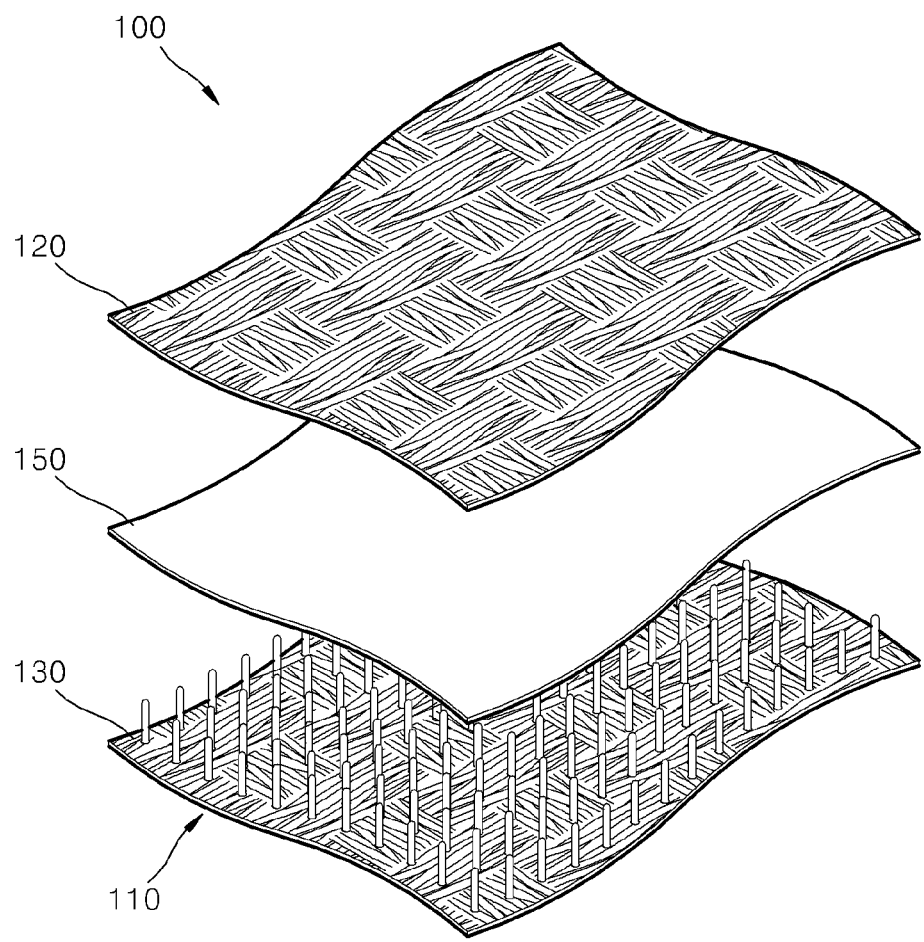
FIG. 1A is a schematic exploded perspective view of an electric energy generating device according to example embodiments.

Reference will now be made in detail to non-limiting embodiments, examples of which are illustrated in the accompanying drawings, wherein like reference numerals refer to like elements throughout. In this regard, example embodiments may have different forms and should not be construed as being limited to the descriptions set forth herein. In the drawings, the thickness of layers and regions may be exaggerated for clarity. Accordingly, example embodiments are merely described below, by referring to the figures, to explain aspects of the present description.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1A is a schematic exploded perspective view of an electric energy generating device 100 according to example embodiments. FIG. 2 is an enlarged view of main elements of the electric energy generating device 100 of FIG. 1A.

Referring to FIGS. 1A and 2, a first textile substrate 110 and a second textile substrate 120 are disposed apart from each other. The first and second textile substrates 110 and 120 may include a conductive material. For example, the first textile substrate 110 may include a non-conductive first textile 111 and a first conductive layer 112 coated on the first textile 111. The second textile substrate 120 may include a non-conductive second textile 121 and a second conductive layer coated on the second textile 121. Each of the first and second textiles 111 and 121 may have a two-dimensional (2D) structure, in which a plurality of fiber strands are interwoven in a desired (and/or alternatively predetermined) pattern as illustrated in FIG. 1A. The first and second textiles 111 and 121 may have flexible and stretchable characteristics. The first and second conductive layers 112 and 122 may be formed of, for example, high electrical conductivity metal, such as gold (Au), but example embodiments are not limited thereto and the first and second conductive layers 112 and 122 may be formed of any of other various materials. If the first and second textile substrates 110 and 120 are used as substrates in the electric energy generating device 100, then the electric energy generating device 100 may respond sensitively to low intensity input energy, e.g., external noise or vibration, due to flexible and stretchable characteristics of the textile substrates, thereby more efficiently generating electric energy.

The length and width of the first 110 and second 120 textile substrates is not limiting. For example, the length and width of the first 110 and second 120 textile substrates may be about 1 cm×1 cm to about 10 cm×10 cm, but example embodiments are not limited thereto. Because large substrates may vibrate more freely, as the substrate size becomes larger, the output voltage may become larger.

A piezoelectric structure including a material having piezoelectric characteristics is disposed on the first textile substrate 110. The piezoelectric structure may include a plurality of piezoelectric nano wires 130, but example embodiments are not limited thereto. When the piezoelectric nano wires 130 are deformed by an external mechanical force, a piezoelectric effect obtained due to the deformation induces a voltage at both ends of the deformed piezoelectric nano wires 130, thereby generating electric energy. The piezoelectric nano wires 130 may be formed of an n type or p type semiconductor material. In detail, the piezoelectric nano wires 130 may include, for example, ZnO, lead zirconium titanate (PZT), $BaTiO_3$, or the like, but are not limited thereto and may include any of other various piezoelectric materials. The piezoelectric nano wires 130 may be formed by growing a piezoelectric material on the first conductive layer 112 of the first textile substrate 110, for example, by chemical vapor deposition (CVD) or according to a hydrothermal synthesis method. Thus, the piezoelectric nano wires 130 may be formed perpendicularly or inclined at a desired (and/or alternatively predetermined) angle with respect to the first conductive layer 112 of the first textile substrate 110. The piezoelectric nano wires 130 may be shaped in such a manner that diameters thereof are the same in a lengthwise direction.

Figure 2A:
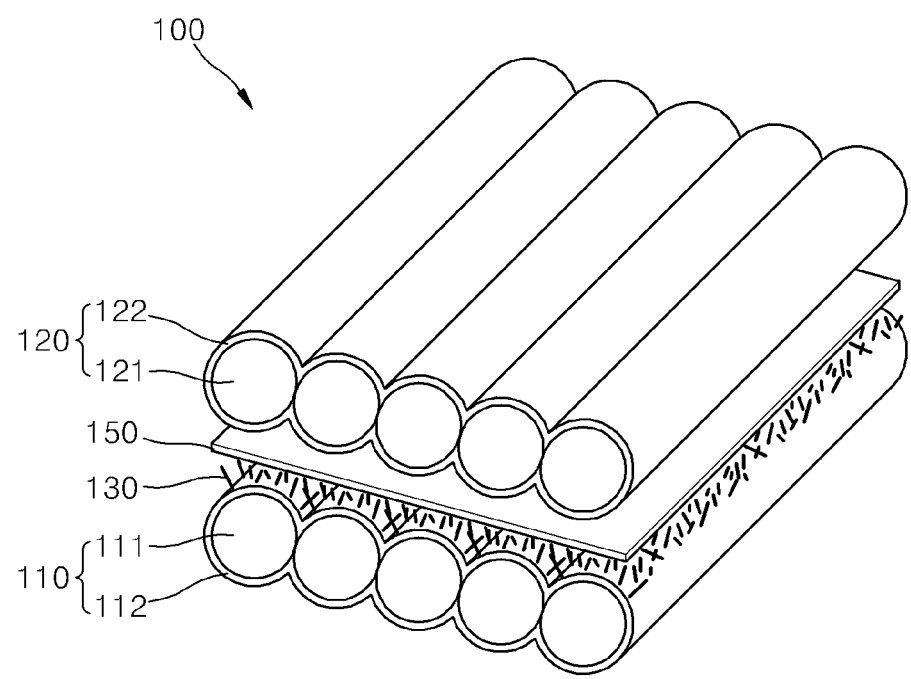
FIG. 2A is an enlarged view of main elements of the electric energy generating device of FIG. 1A.

While FIGS. 1A and 2A illustrate a piezoelectric structure including piezoelectric nano wires 130, example embodiments are not limited thereto. Instead of nano wires 130 or in addition to nano wires, the piezoelectric structure may include other shapes (e.g., nano tubes, nano particles, nano belts, nano cones, micro wires, micro tubes, micro particles, micro belts, micro cones, and the like) of the materials (e.g., ZnO, lead zirconium titanate (PZT), $BaTiO_3$, and the like). When nano wires or micro wires are used, the diameter and length of the nano wire or micro wire may be varied from several nanometers to several hundred micrometers, and the nano wires and micro wires may include an aspect ratio (height/diameter) of about 3 to about 10. For example, the nano wires 130 may include a diameter of about 200 nm and a length of about 2 to 4 microns, but example embodiments are not limited thereto.

An insulating film 150 is disposed between the piezoelectric nano wires 130 and the second textile substrate 120. The insulating film 150 may include a material having electret characteristics. Here, the material having electret characteristics means a material with semi-permanent surface charges or semi-permanent polarization. Thus, the insulating film 150 may have a plurality of (−) or (+) surface charges. Alternatively, the insulating film 150 may be formed of a material, one surface of which has a plurality of (+) surface charges and another surface of which has a plurality of (−) surface charges. Specifically, when the piezoelectric nano wires 130 includes an n type semiconductor material, a surface of the insulating film 150 facing the piezoelectric nano wires 130, i.e., a lower surface of the insulating film 150, may have a plurality of (−) surface charges. In this case, the insulating film 150 may be formed of a material having a plurality of (−) surface charges or a material that is strongly polarized so that a lower surface thereof may have a plurality of (−) surface charges. When the piezoelectric nano wires 130 includes a p type semiconductor material, the surface of the insulating film 150 facing the piezoelectric nano wires 130, i.e., the lower surface of the insulating film 150, may have a plurality of (+) surface charges. In this case, the insulating film 150 may be formed of a material having a plurality of (+) surface charges or a material that is strongly polarized so that a lower surface thereof may have a plurality of (+) surface charges.

Since the insulating film 150 has insulating characteristics, the insulating film 150 may limit (and/or prevent) a short circuit from occurring when the first and second textile substrates 110 and 120 contact each other. Also, since the insulating film 150 has electret characteristics, a voltage may be induced according to a change in electrostatic capacitance when a distance between the insulating film 150 and the first textile substrate 110 is changed by external energy, e.g., mechanical energy or vibration energy. The insulating film 150 may include, for example, a polymer-based material or an inorganic material. The polymer-based material may include fluoropolymers, polyethylene (PE), polypropylene (PP), polyethylene terephtalate (PET), polyimide (PI), polymethylmethacrylate (PMMA), polyvinylylidenefluoride (PVDF), ethylene vinyl acetate (EVA), cellular polypropylene, porous polytetrafluoroethylene (PTFE), or the like. The fluoropolymers may include polytetrafluorethylene (PTFE) or poly(tetrafluoroethyle-co-hexafluoropropylene) (FEP). The polyethylene (PE) may include high-density polyethylene (HDPE), low-density polyethylene (LDPE), or cross-linking polyethylene (XLPE). The inorganic material may include a silicon oxide, a silicon nitride, an aluminum oxide, a photorefractive material, or glass formed by adding sodium (Na), selenium (Se), or boron (B) to a silicon oxide. The above materials are just illustrative and any of various other materials may be used to form the insulating film 150.

The thickness of the insulating layer 150 may be varied from several nanometers to several millimeters, but example embodiments are not limited. For example may be about 100 nm to 100 microns. Additionally, the insulating layer 150 may include a single layer or a mullet-layer. For example, the insulating layer 150 may be formed as a multi-layer structure including two or more layers of polymer-based materials, two or more layers of inorganic material, or at least one layer having a polymer-based material and at least one layer having an inorganic material, but example embodiments are not limited thereto.

Figure 1B:
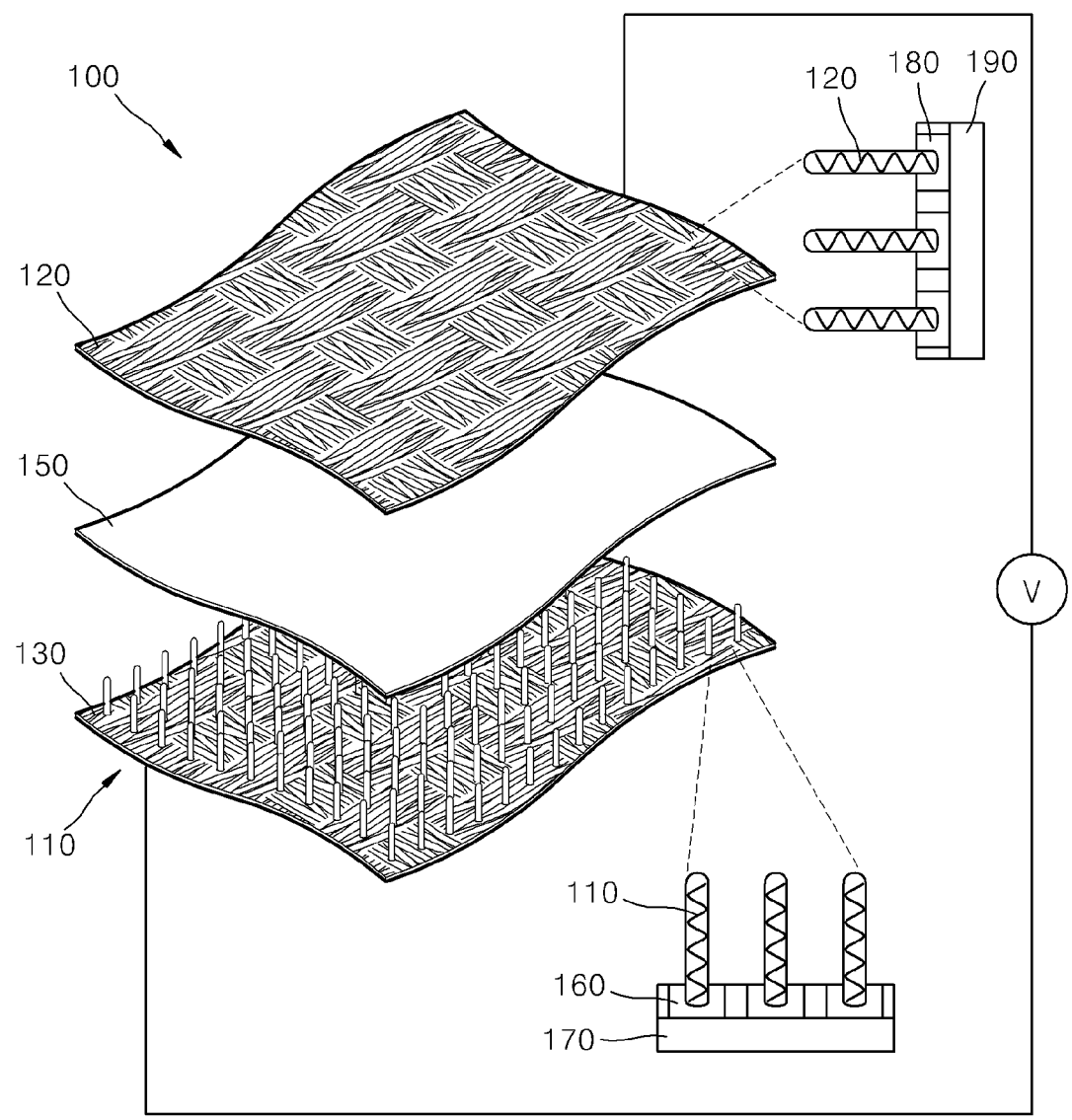
FIG. 1B is a schematic exploded perspective view of the electric energy generating device of FIG. 1A connected to an external circuit.

FIG. 1B is a schematic exploded perspective view of the electric energy generating device 100 of FIG. 1A connected to an external circuit.

Referring to FIG. 1B, the first textile substrate 110 may be electrically connected to first pads 160 on a first circuit board 170. The second textile substrate 120 may be electrically connected to second pads 180 on a second circuit board 190. Thereby, the output voltage V generated during operation of the electric energy generating device 100 may be collected through the first circuit board 170 and the second circuit board 190, respectively, and supplied to power at least one external circuit (not shown), although example embodiments are not limited thereto.

Figure 1C:
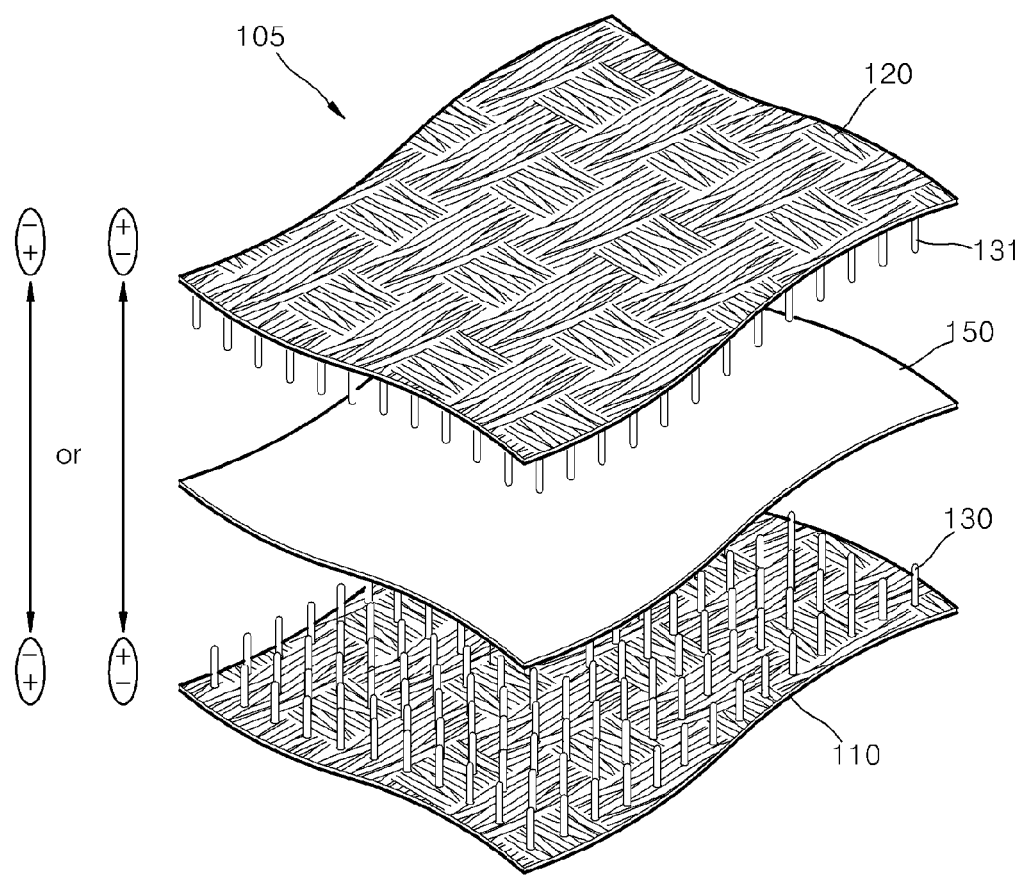
FIG. 1C is a schematic exploded perspective view of an electric energy generating device according to example embodiments.

FIG. 1C is a schematic exploded perspective view of an electric energy generating device 105 according to example embodiments.

Referring to FIG. 1C, the electric energy generating device 105 includes piezoelectric nano wires 130 on the first textile substrate 110 and piezoelectric nano wires 131 on the second textile substrate 120. The nano wires 131 may be similar to the nano wires 130, as described above, except the material used for the nano wires 131 in the electric energy generating device 105 depends on the material selected for the nano wires 130 in the electric energy generating device. The nano wires 130 and 131 in FIG. 1C may be selected according to the polling direction illustrated in FIG. 1C, −+←→−+ or +−←→+−. For example, in the electric energy generating device 105, one of the nano wires 130 and 131 may be formed of an n-type semiconductor material and the other of the nano wires may be of a p-type semiconductor material.

Figure 2B:
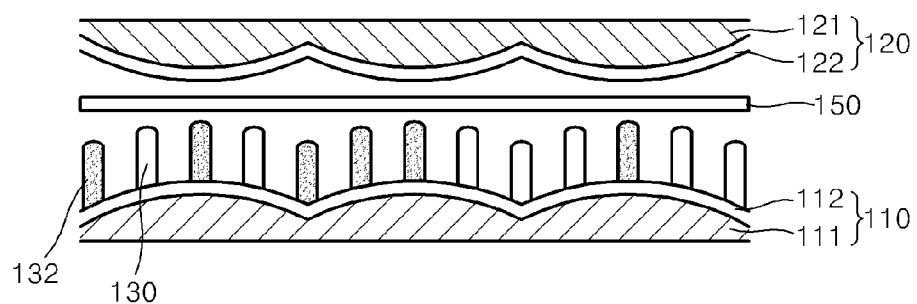
FIGS. 2B and 2C are enlarged views of main elements of electric energy generating devices according to example embodiments.
Figure 2C:
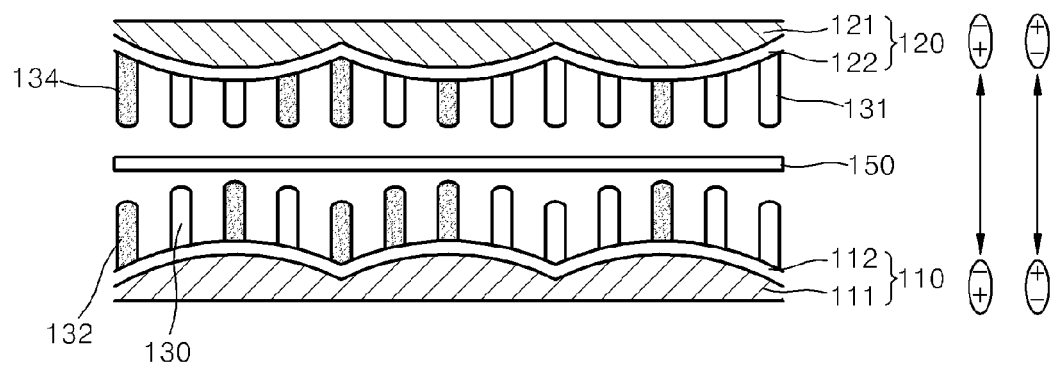

FIGS. 2B and 2C are enlarged views of main elements of electric energy generating devices according to example embodiments.

Referring to FIG. 2B, an electric energy generating device according to example embodiments includes piezoelectric nano wires 130 and 132 on the first textile substrate 110. The materials of the piezoelectric nano wires 130 and 132 are different, but piezoelectric nano wires may both have the same conductivity type, for example n-type or p-type semiconductor.

Referring to FIG. 2C, an electric energy generating device according to example embodiments further includes piezoelectric nano wires 131 and 134 on the second textile substrate 120. The nano wires 130 to 134 in FIG. 2C may selected according to the polling direction illustrated in FIG. 2C, −+←→−+ or +−←→+−. For example, nano wires 130 and 132 may be formed of different n-type semiconductor materials and nano wires 131 and 134 may be formed of different p-type semiconductor materials, but example embodiments are not limited thereto. For example, nano wires 130 and 132 may be formed of different p-type semiconductor materials and nano wires 131 and 134 may be formed of different n-type semiconductor materials.

Alternatively, at least one of the nano wires 130 and 132, and/or at least one of the nano wires 133 and 134, as shown in FIG. 2C may be omitted without limitation, provided that the electric energy generating device includes at least one of the nano wires 130 to 134.

Figure 3A:
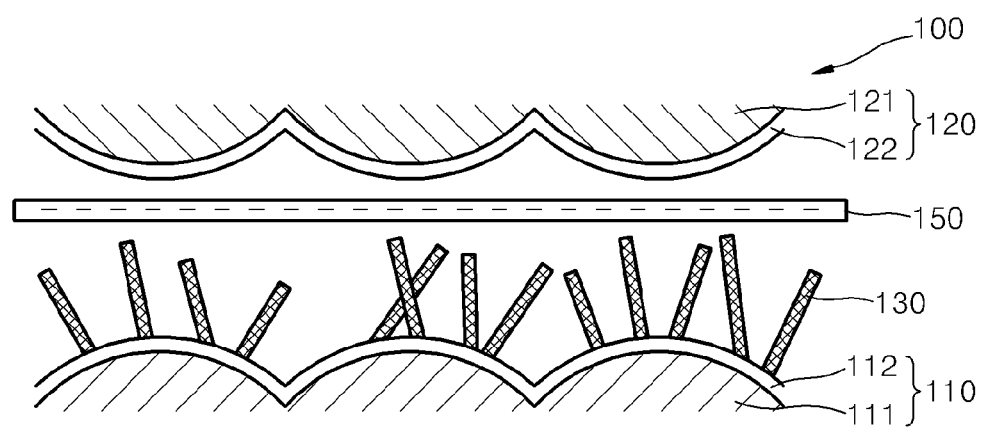
FIGS. 3A to 3C are views illustrating a process of generating electric energy by using the electric energy generating device of FIG. 1A, according to example embodiments.
Figure 3B:
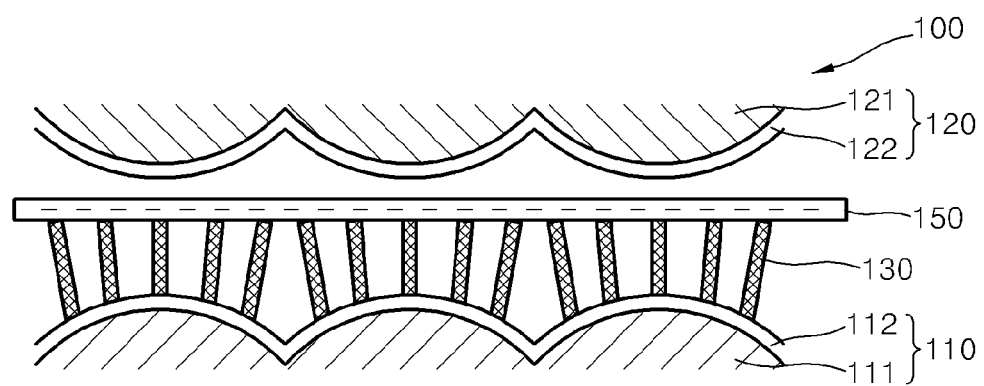
Figure 3C:
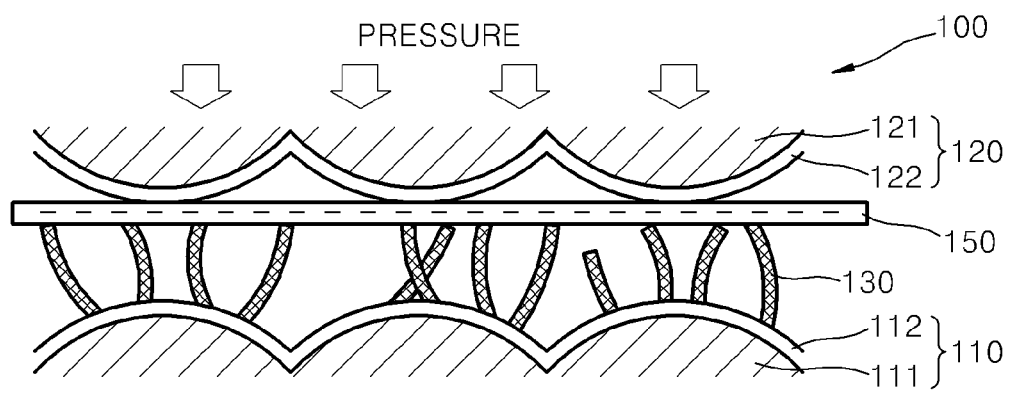

FIGS. 3A to 3C are views illustrating a process of generating electric energy by using the electric energy generating device 100 of FIG. 1A, according to example embodiments. Specifically, FIG. 3A illustrates a state in which the electric energy generating device 100 is non-pressurized, i.e., no external energy is supplied to the electric energy generating device 100. FIG. 3C illustrates a state in which the electric energy generating device 100 is pressurized, since external energy is supplied thereto, i.e., a mechanical force is applied to the electric energy generating device 100, for example, due to external noise or vibration.

Referring to FIG. 3A, when no external mechanical force is applied to the electric energy generating device 100, the piezoelectric nano wires 130 on the first textile substrate 110, the insulating film 150 having electret characteristics, and the second textile substrate 120 may be disposed apart from each other by a distance.

Even when no external mechanical force is applied to the electric energy generating device 100, the second textile substrate 120, the insulating film 150, and the piezoelectric nano wires 130 may contact one another. In this case, the piezoelectric nano wires 130 may not be deformed, and a distance between the insulating film 150 and the first textile substrate 110 may be maintained constant. Thus, when no external mechanical force is applied to the electric energy generating device 100, the piezoelectric nano wires 130 are not deformed, and induction of voltage due to the piezoelectric effect may not occur. Also, since the distance between the insulating film 150 and the first textile substrate 110 is maintained constant, induction of voltage due to a change in an electrostatic capacitance between the insulating film 150 and the first textile substrate 110 may not occur.

For example, referring to FIG. 3B, FIG. 3B illustrates the insulating film 150 contacting the piezoelectric nano wires 130 when no mechanical force is applied. As shown in FIG. 3B, the piezoelectric nano wires 130 are not deformed. Alternatively, although not shown, the insulating film 150 may also contact the second textile substrate 120 and/or both the second textile substrate 120 and the piezoelectric nano wires 130 when no mechanical force is applied.

Next, referring to FIG. 3C, when external energy is supplied to the electric energy generating device 100, for example, through mechanical force due to noise or vibration, pressure is applied to the electric energy generating device 100 in a direction in which the second textile substrate 120 pressurizes the first textile substrate 110. Thus, the second textile substrate 120, the insulating film 150 having electret characteristics, and the piezoelectric nano wires 130 may contact one another. Also, since the insulating film 150 pressurizes upper surfaces of the piezoelectric nano wires 130, the piezoelectric nano wires 130 may be deformed. The insulating film 150 may limit (and/or prevent) a short circuit that may occur between the first and second textile substrates 110 and 120. As described above, when external energy is supplied to the electric energy generating device 100, for example, through mechanical force, the piezoelectric nano wires 130 is deformed to cause the piezoelectric effect to occur. The piezoelectric effect may induce a voltage at both ends of the piezoelectric nano wires 130. Also, as a distance between the insulating film 150 and the first textile substrate 110 is changed, an electrostatic capacitance there between changes to induce a voltage between the first and second textile substrates 110 and 120. Accordingly, when external energy is supplied to the electric energy generating device 100 according to example embodiments, a voltage is induced according to the piezoelectric effect and according to a change in an electrostatic capacitance, thereby obtaining a high output voltage.

Also, in an electric energy generating device 100 according to example embodiments, the piezoelectric characteristics of the piezoelectric nano wires 130 are improved owing to surface charges of the insulating film 150 having electret characteristics, thereby obtaining a higher output voltage. Specifically, a case where the insulating film 150 is formed of a material having (−) surface charges and the piezoelectric nano wires 130 are formed of an n type semiconductor material, is described below. Referring to FIG. 3C, when an external mechanical force is applied to the electric energy generating device 100, the insulating film 150 contacts the upper surfaces of the piezoelectric nano wires 130 and the piezoelectric nano wires 130 are then deformed. Thus, as distances between the insulating film 150 having (−) surface charges, the first textile substrate 110, and the second textile substrate 120 are changed, an electrostatic capacitance between the insulating film 150 and the first textile substrate 110 changes to respectively induce a (−) potential and a (+) potential to the first and second textile substrates 110 and 120. Also, as the piezoelectric nano wires 130 contacting the insulating film 150 are deformed, the piezoelectric effect occurs. In this case, the piezoelectric effect of the piezoelectric nano wires 130 may be greatly improved owing to the (−) surface charges of the insulating film 150 contacting the piezoelectric nano wires 130. Specifically, if the piezoelectric nano wires 130 are deformed while the insulating film 150 contacts the piezoelectric nano wires 130, then an electrostatic field generated from the (−) surface charges of the insulating film 150 may cause electrons in the piezoelectric nano wires 130 to be redistributed. The redistribution of the electrons may more greatly enhance the piezoelectric characteristics of the piezoelectric nano wires 130. The improved piezoelectric effect may respectively induce a (+) potential and a (−) potential on the upper surfaces and lower surfaces of the piezoelectric nano wires 130. Here, a voltage induced on the upper and lower surfaces of the piezoelectric nano wires 130 may be higher than when the piezoelectric nano wires 130 are deformed without using the insulating film 150. As described above, in the electric energy generating device 100 according to example embodiments, a voltage is induced due to a change in an electrostatic capacitance between the insulating film 150 and the first textile substrate 110, and is induced due to the enhanced piezoelectric effect, caused by deformation of the piezoelectric nano wires 130 and surface charges of the insulating film 150 contacting the piezoelectric nano wires 130, thereby obtaining a higher output voltage.

An electric energy generating device using only a change in an electrostatic capacitance, an electric energy generating device using only the piezoelectric effect, and an electric energy generating device using a synergy effect of the piezoelectric effect and a change in an electrostatic capacitance, according to example embodiments, will now be compared with one another.

Figure 4A:
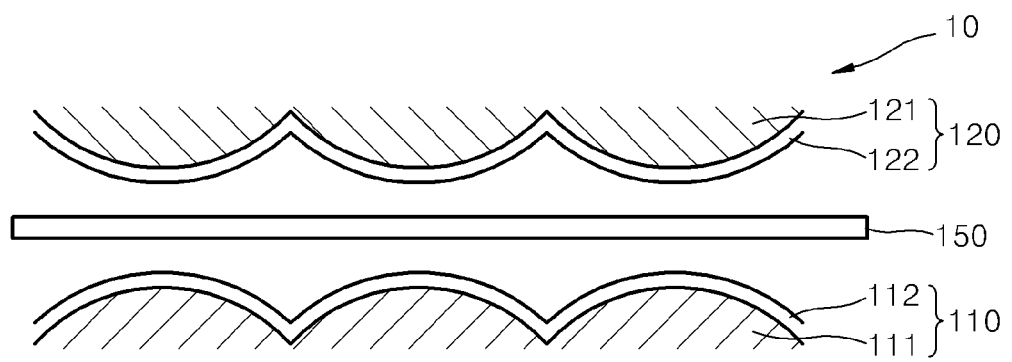
FIG. 4A is a schematic view of an electric energy generating device using only a change in an electrostatic capacitance.

FIG. 4A is a schematic view of an electric energy generating device 10 using only a change in an electrostatic capacitance. Referring to FIG. 4A, an insulating film 150 having electret characteristics is disposed between first and second textile substrates 110 and 120. When external energy is supplied to the electric energy generating device 10, for example, through a mechanical force, a distance between the insulating film 150 and the first textile substrate 110 is changed, and thus, an electrostatic capacitance between the insulating film 150 and the first textile substrate 110 may change. The change in the electrostatic capacitance may induce a voltage between the first and second textile substrates 110 and 120.

Figure 4B:
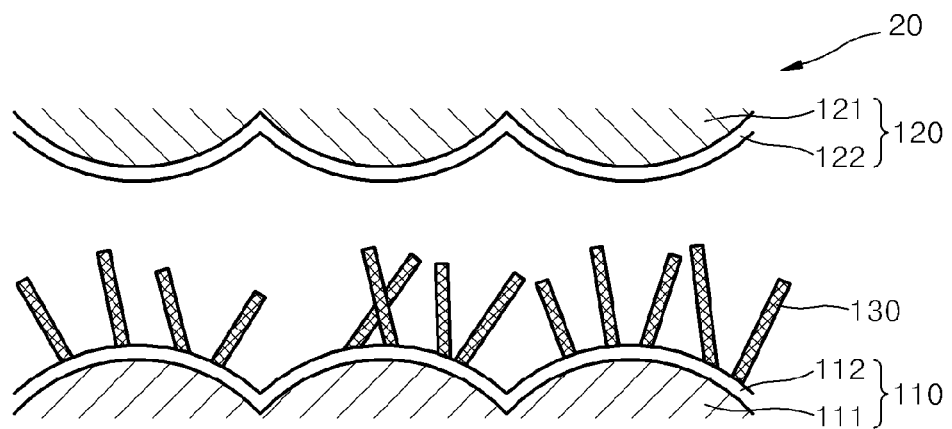
FIG. 4B is a schematic view of an electric energy generating device using only a piezoelectric effect.

FIG. 4B is a schematic view of an electric energy generating device 20 using only the piezoelectric effect. Referring to FIG. 4B, a plurality of piezoelectric nano wires 130 are formed on a first textile substrate 110, and a second textile substrate 120 is disposed on the piezoelectric nano wires 130. When external energy is supplied to the electric energy generating device 20, for example, through a mechanical force, then the second textile substrate 120 may pressurize the piezoelectric nano wires 130, thereby deforming the piezoelectric nano wires 130. The piezoelectric effect occurring due to the deformation of the piezoelectric nano wires 130 induces a voltage at both ends of the piezoelectric nano wires 130.

Figure 4C:
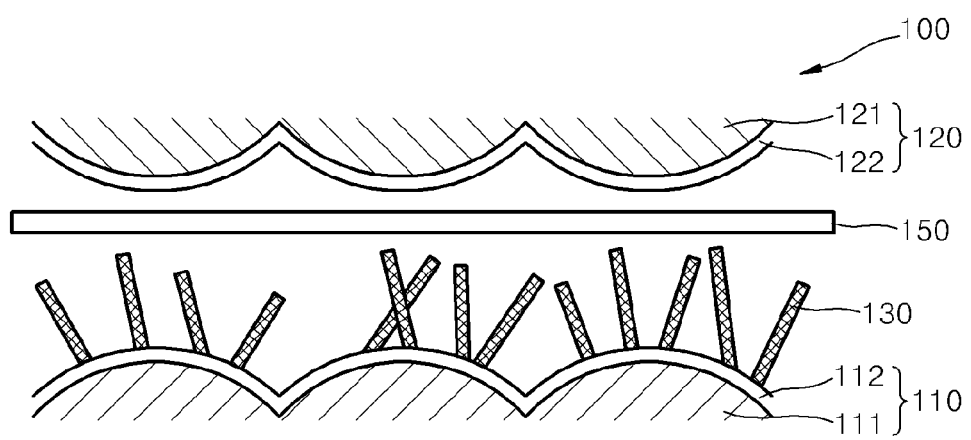
FIG. 4C is a schematic view of an electric energy generating device using a synergy effect of the piezoelectric effect and the change in the electrostatic capacitance, according to example embodiments.

FIG. 4C is a schematic view of an electric energy generating device 100 using a synergy effect of the piezoelectric effect and the change in the electrostatic capacitance, according to example embodiments. Referring to FIG. 4C, a plurality of piezoelectric nano wires 130 are formed on a first textile substrate 110, and an insulating film having electret characteristics is disposed between the piezoelectric nano wires 130 and the second textile substrate 120. As described above, when external energy is supplied to the electric energy generating device 100, for example, through a mechanical force, a voltage is induced due to a change in an electrostatic capacitance and is induced according to the piezoelectric effect.

Figure 5A:
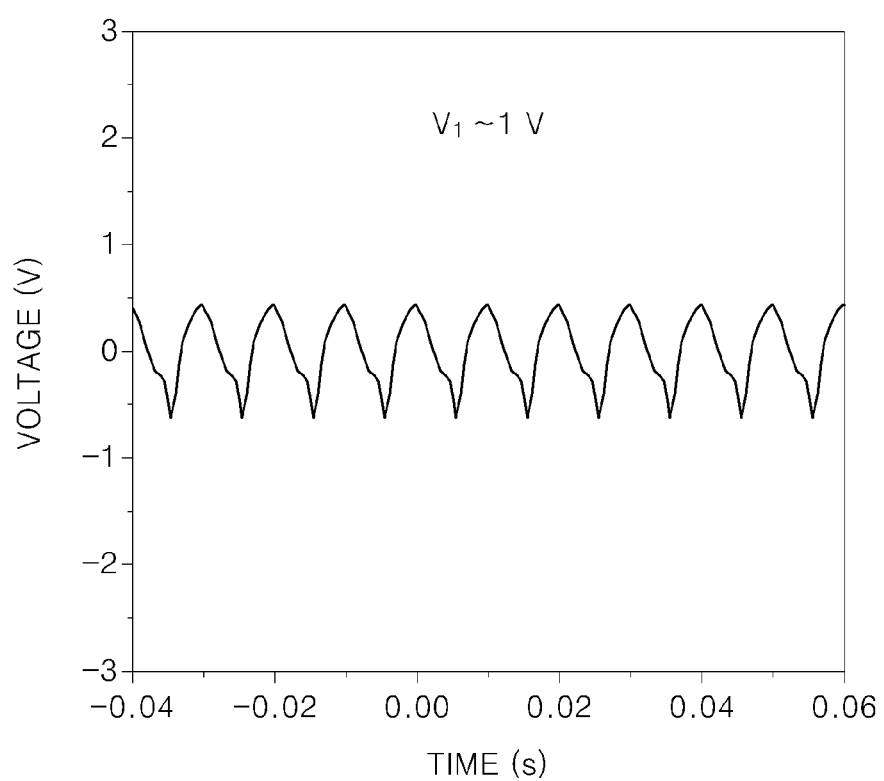
FIGS. 5A to 5C are graphs respectively showing output voltages generated by the electric energy generating devices of FIGS. 4A to 4C.
Figure 5B:
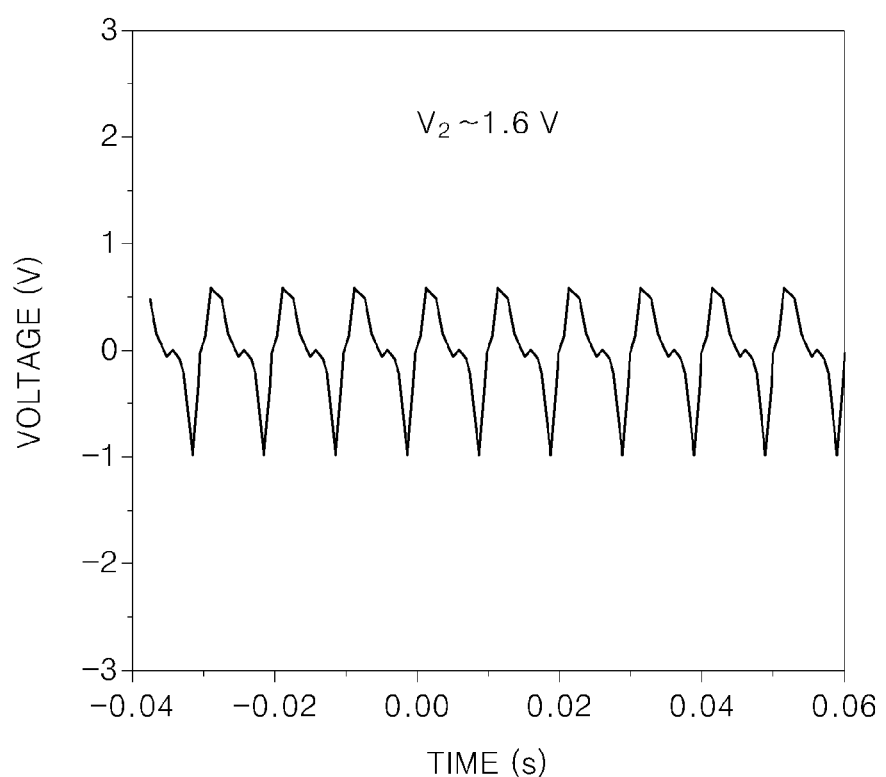
Figure 5C:
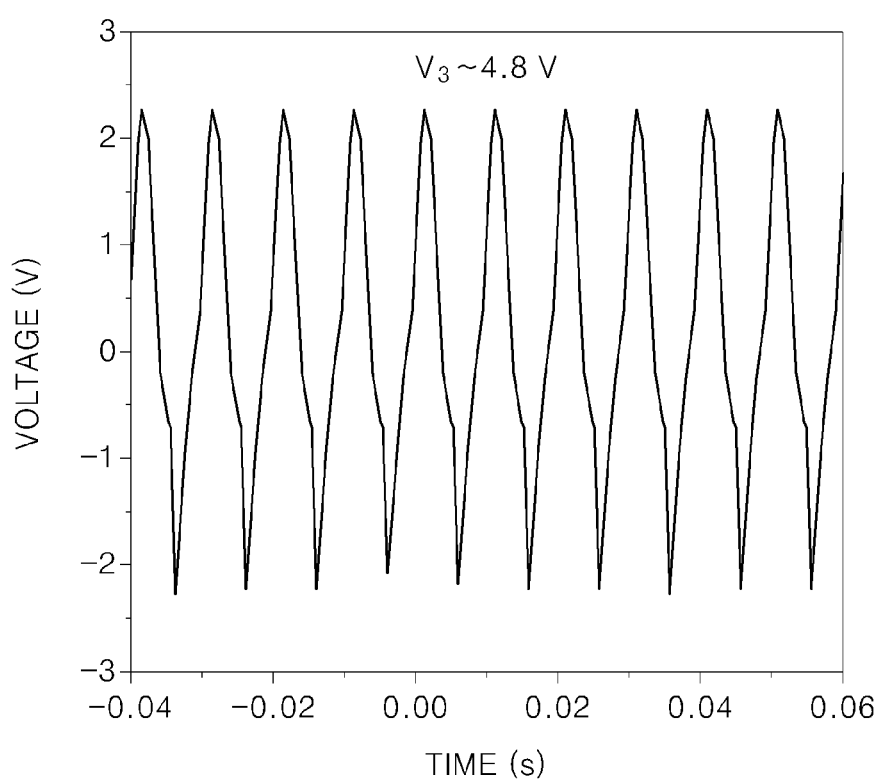

FIGS. 5A to 5C are graphs respectively showing output voltages generated by the electric energy generating device 10 of FIG. 4A, the electric energy generating device 20 of FIG. 4B, and the electric energy generating device 100 of FIG. 4C. Specifically, FIG. 5A is a graph showing a variation in an output voltage $V_1$ generated by the electric energy generating device 10 of FIG. 4A, which uses only a change in an electrostatic capacitance. FIG. 5B is a graph showing a variation in an output voltage $V_2$ generated by the electric energy generating device 20 of FIG. 4B, which uses only the piezoelectric effect. FIG. 5C is a graph showing a variation in an output voltage $V_3$ generated by the electric energy generating device 100 of FIG. 4C using a synergy effect of the piezoelectric effect and the change in the electrostatic capacitance, according to example embodiments. FIGS. 5A to 5C respectively illustrate the output voltages $V_1$ to $V_3$ induced when a sound wave of about 100 dB and a sound wave of about 100 Hz were applied to the electric energy generating devices 10, 20, and 100 illustrated in FIGS. 4A to 4C by using a speaker. Here, an electret film having (−) surface charges was used as the insulating film 150, and n type ZnO nano wires were used as the piezoelectric nano wire 130. Also, textile substrates, the surfaces of which are coated with gold (Au), were used as the first and second textile substrates 110 and 120.

Referring to FIGS. 5A to 5C, the output voltage $V_1$ generated by the electric energy generating device 10 using only the change in the electrostatic capacitance was about 1 V, and the output voltage $V_2$ generated by the electric energy generating device 20 using only the piezoelectric effect was about 1.6 V. The output voltage $V_3$ generated by the electric energy generating device 100 of FIG. 4C using a synergy effect of the piezoelectric effect and the change in the electrostatic capacitance, according to example embodiments, was about 4.8 V. Thus, the output voltage $V_3$ generated by the electric energy generating device 100 is far higher than the sum of the output voltage $V_1$ induced using the change in the electrostatic capacitance and the output voltage $V_2$ induced using the piezoelectric effect. This is because in the electric energy generating device 100 of FIG. 4C according to example embodiments, a voltage is induced using the change in the electrostatic capacitance between the insulating film 150 and the first textile substrate 110 and is induced using deformation of the piezoelectric nano wires 130 and the enhanced piezoelectric effect according to surface charges of the insulating film 150, as described above.

Figure 6:
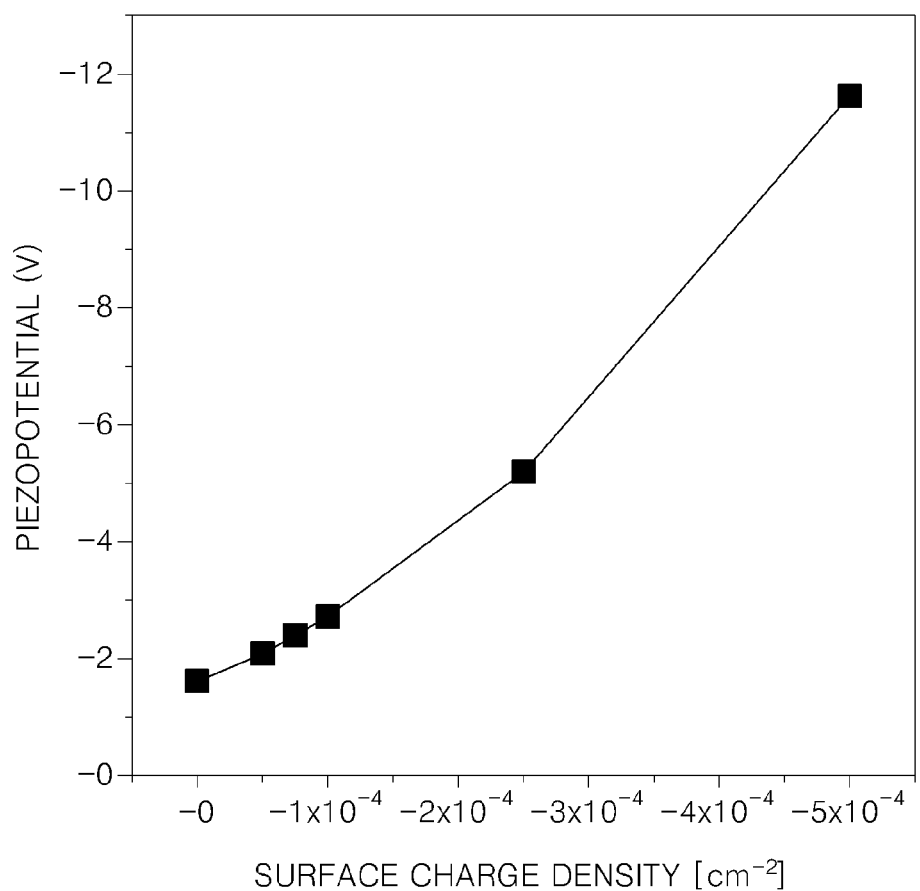
FIG. 6 is a graph showing a result of a simulation, in which, when a force ($T_Z = -2.05 \times 10^8$ Pa) was applied to piezoelectric nano wires in a lengthwise direction while changing an amount (or density) of (−) surface charges attached to the piezoelectric nano wires, a piezoelectric potential induced in the piezoelectric nano wires according to the amount (or density) of the surface charges was calculated.

FIG. 6 is a graph showing a result of a simulation, in which, when a force ($T_z=−2.05×10^8$ Pa) was applied to the piezoelectric nano wires 130 of FIG. 1A in a lengthwise direction while changing an amount (or density) of (−) surface charges attached to the piezoelectric nano wires 130, a piezoelectric potential induced in the piezoelectric nano wires 130 according to the amount (or density) of the surface charges was calculated. In the simulation, n type nano wires were used as the piezoelectric nano wires 130. Referring to FIG. 6, as the density of the (−) surface charges attached to the piezoelectric nano wires 130 increases, the piezoelectric potential induced in the piezoelectric nano wires 130 also increases. The simulation reveals that if in the electric energy generating device 100 of FIG. 1A according to example embodiments, the insulating film 150 having electret characteristics is attached to upper surfaces of the piezoelectric nano wires 130 through an external mechanical force, then piezoelectric characteristics of the piezoelectric nano wires 130 may be enhanced owing to surface charges of the insulating film 150 contacting the upper surfaces of the piezoelectric nano wires 130.

As described above, in the electric energy generating device 100 according to example embodiments, a higher output voltage may be obtained since a voltage is induced using the change in the electrostatic capacitance between the insulating film 150 and the first textile substrate 110 and is induced using deformation of the piezoelectric nano wires 130 and the enhanced piezoelectric effect caused by the surface charges of the insulating film 150 contacting the piezoelectric nano wires 130. Also, since the electric energy generating device 100 employs the first and second textile substrates 110 and 120 having flexible and stretchable characteristics as substrates, the electric energy generating device may respond sensitively to even low-intensity input energy, such as external noise, and may thus efficiently generate electrical energy from the low-intensity input energy.

Figure 7:
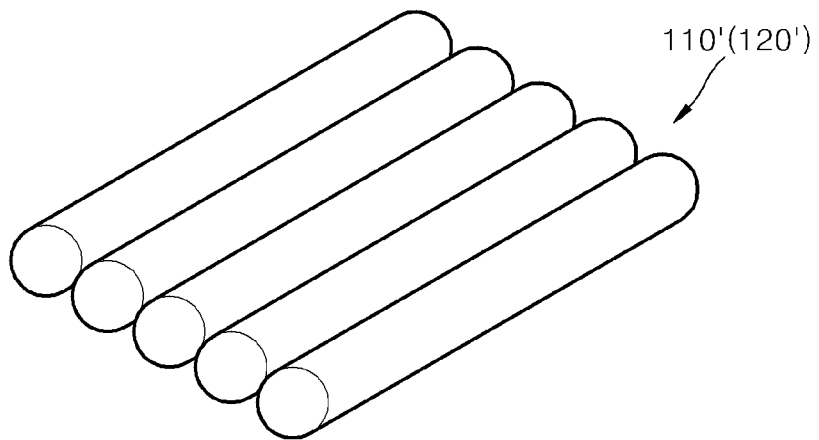
FIG. 7 illustrates a modified example of textile substrates used in an electric energy generating device according to example embodiments.

According to example embodiments, the first textile substrate 110 is formed of the first non-conductive textile 111 and the first conductive layers 112 coated on the first non-conductive textile 111, and the second textile substrate 120 is formed of the second non-conductive textile 121 and the first conductive layers 112 coated on the second non-conductive textile 122. However, example embodiments are not limited thereto and first and second textile substrates 110' and 120' may be respectively formed of only conductive textiles as illustrated in FIG. 7. The structures of the first and second textile substrates 110, 110', 120, and 120' illustrated in FIGS. 2 and 7 are just illustrative, and textile substrates having any of various other structures may be used. Also, in the above embodiments, textile substrates are used but various types of substrate, e.g., a silicon substrate or a flexible substrate, may be used.

In the example embodiments, the piezoelectric nano wires 130 on the first textile substrate 110 may be shaped in such a manner that diameters thereof are the same in a lengthwise direction. However, piezoelectric nano wires may be grown in any of various shapes by adjusting growth conditions thereof.

Figure 8A:
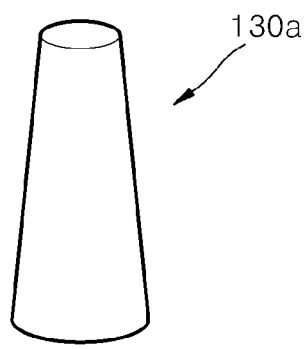
FIGS. 8A to 8C illustrate modified examples of a piezoelectric structure, e.g., piezoelectric nano wires used in the electric energy generating device of FIG. 1A, according to example embodiments.
Figure 8B:
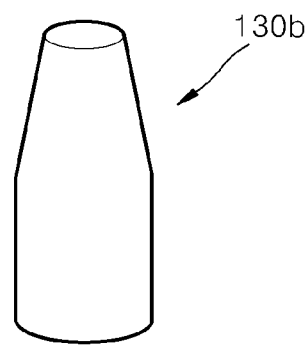
Figure 8C:
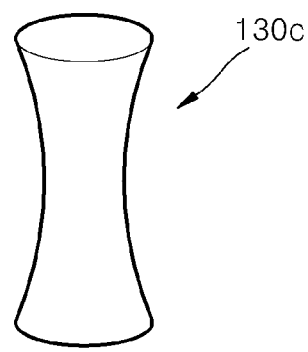

FIGS. 8A to 8C illustrate modified examples of a piezoelectric structure, e.g., the piezoelectric nano wires 130 of FIG. 1A, according to example embodiments. Specifically, FIG. 8A illustrates a piezoelectric nano wire 130*a*, the diameter of which gradually reduces in a lengthwise direction. FIG. 8B illustrates a piezoelectric nano wire 130*b*, the diameter of which is maintained constant to a desired (and/or alternatively predetermined) degree and then gradually reduces, in a lengthwise direction. FIG. 8C illustrates a piezoelectric nano wire 130*c*, the diameter of which gradually increases to a desired (and/or alternatively predetermined) degree from the center in both lengthwise directions. The shapes of the piezoelectric nano wires 130, 130*a*, 130*b*, and 130*c* are just illustrative, and piezoelectric nano wires having any of other various shapes may be used.

Also, in the above embodiments, the piezoelectric nano wires 130 are illustrated as an example of a piezoelectric structure used in an electric energy generating device, but any of other types of piezoelectric structure may be used.

Figure 9:
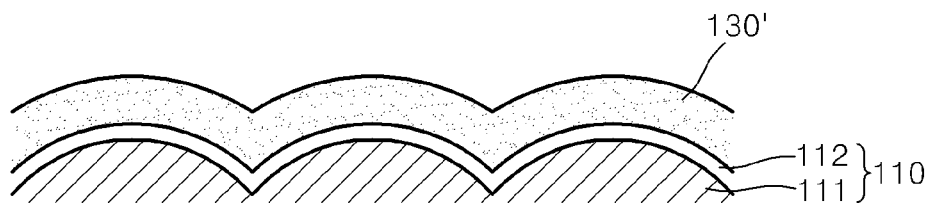
FIG. 9 illustrates a piezoelectric structure used in an electric energy generating device, according to example embodiments.

FIG. 9 illustrates a piezoelectric structure used in an electric energy generating device, according to example embodiments. Referring to FIG. 9, a piezoelectric structure may be disposed on a first textile substrate 110. The piezoelectric structure may be a piezoelectric material layer 130' coated on the first textile substrate 110. The piezoelectric material layer 130' may include, for example, a polymer-based piezoelectric material, e.g., polyvinylidene fluoride (PVDF) but is not limited thereto. As discussed above, an electric energy generating device having a single-layered structure with two substrates and a piezoelectric structure between the two substrates has been described, but example embodiments are not limited thereto and an electric energy generating device may have a double-layered structure or a multi-layered structure.

Described below is a non-limiting method of making an electric energy generating device according to example embodiments; however, example embodiments are not limited the method described below.

The textile substrate was composed of network of artificial fibers made from polyester. The polyester (PS) fiber is produced by pulling it out to fabricate long strand, and by weaving it the textile substrate is formed. Thin Au electrode (~5 nm) was deposited onto the both sides of the textile substrate using a RF magnetron sputter. On top of this, ZnO nano wires were then grown using a hydrothermal method, and thin self-adhesive PE film (40 μm) as an insulating layer was placed on top of the ZnO NWs. The vibrating plate, another Au coated textile substrate acting as a top electrode was placed on the insulating layer. The inserted PE film is anchored at the edge and freely vibrated between the ZnO NWs and the top electrode of the textile. The top and bottom of the textile were sealed at the edges for the robust integration and the electrodes were attached using a silver paste on both sides of the textile.

For the uniform growth of ZnO nano wires on large area textile substrate, the seed layers have been grown by dipping textile substrate on 0.02 M Zinc acetate dihydrate solution (Zinc acetate dihydrate+ethanol) for 3 minutes and baked on the hot plate at 200 degrees for 5 minutes. And this process has been repeated for four times. After that, the growth of ZnO nano wires has been followed. The zinc nitrate hexahydrate (98%, Aldrich) and hexamethylenetetramine (99%, Aldrich) solution were prepared in deionized water at 25 mM concentration. Then, Au coated textile substrates were suspended upside-down in a glass bottle filled with an aqueous solution and the glass bottle was heated in the oven at 90° C. After the growth reaction, the as-grown ZnO NWs were air-dried.

Figure 10:
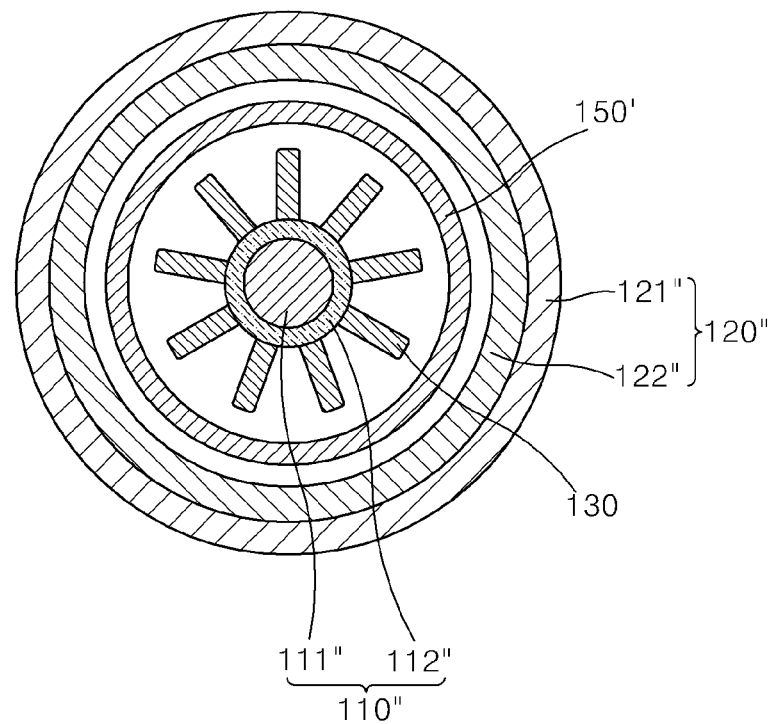
FIG. 10 illustrates a sectional view of an electric energy generating device according to example embodiments.

FIG. 10 illustrates a sectional view of an electric energy generating device according to example embodiments.

Referring to FIG. 10, an electric energy generating device may include the first textile substrate 110". The first textile substrate 110" may include a non-conductive first textile 111" and a first conductive layer 112" coated on the first textile 111". Piezoelectric nano wires 130 may be disposed on first textile substrate 110". An insulating film 150' and a second textile substrate 120" may be formed as around the first textile substrate 110". The second substrate 120" includes a non-conductive second textile 121" and a second conductive layer 122" thereon. While FIG. 10 illustrates the insulating film 150' and the second substrate 120" formed as concentric tubes around the first textile substrate 110" including piezoelectric nano wires 130, example embodiments are not limited thereto.

The first textile substrate 110", first textile 111", and the first conductive layer 112", insulating film 150', second textile substrate 120", second textile 121", and the second conductive layer 122" may include the same materials, respectively, as the first textile substrate 110, first textile 111, and the first conductive layer 112, insulating film 150, second textile substrate 120, second textile 121, and the second conductive layer 122 described above with reference to FIG. 1A.

Figure 11:
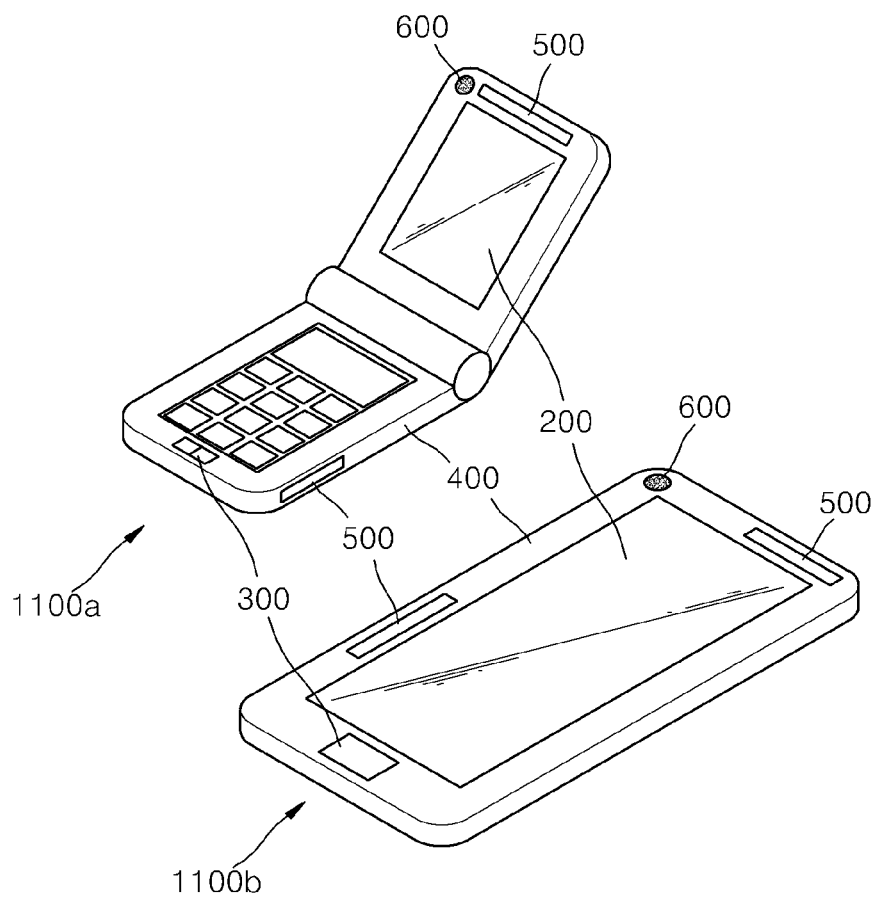
FIG. 11 illustrates a perspective view of phones including an electric energy generating device according to example embodiments.

FIG. 11 illustrates a perspective view of phones 1100*a* and 1100*b* including an electric energy generating device 500 according to example embodiments.

Referring to FIG. 11, each phone 1100*a* and 1100*b* may include a display 200, a microphone 300, a housing 400, and at least one electric energy generating device 500, but example embodiments are not limited thereto. The electric energy generating device 500 may be electrically connected to a circuit (not shown) connected to a power supply (not shown) inside of the housing 400. The location of the electric energy generating device 500 is not particularly limiting; however, one electric energy generating device 500 is preferably located near the microphone 300 or a speaker 600. Accordingly, the electric energy generating device 500 may be configured to harvest mechanical energy from sound waves emanating from the speaker 600 or directed into the microphone 300 and convert the mechanical energy into electrical energy that may be used to power the phones 1100*a* and 1100*b*. The display 200, microphone 300, and speaker 600 may be connected to the circuit.

While FIG. 11 illustrates phones 1100*a* and 1100*b* including electronic energy generating devices 500, example embodiments are not limited thereto. Electronic energy generating devices according to example embodiments may be applied to other electronic devices in order to harvest mechanical energy and/or noise into electrical energy. For example, electronic energy generating devices according to example embodiments may be applied computers, handheld devices, radios, sound systems, personal digital assistants, handheld devices, tablet computers, and the like, in order to convert mechanical energy into electrical energy, but example embodiments are not limited thereto.

Figure 12:
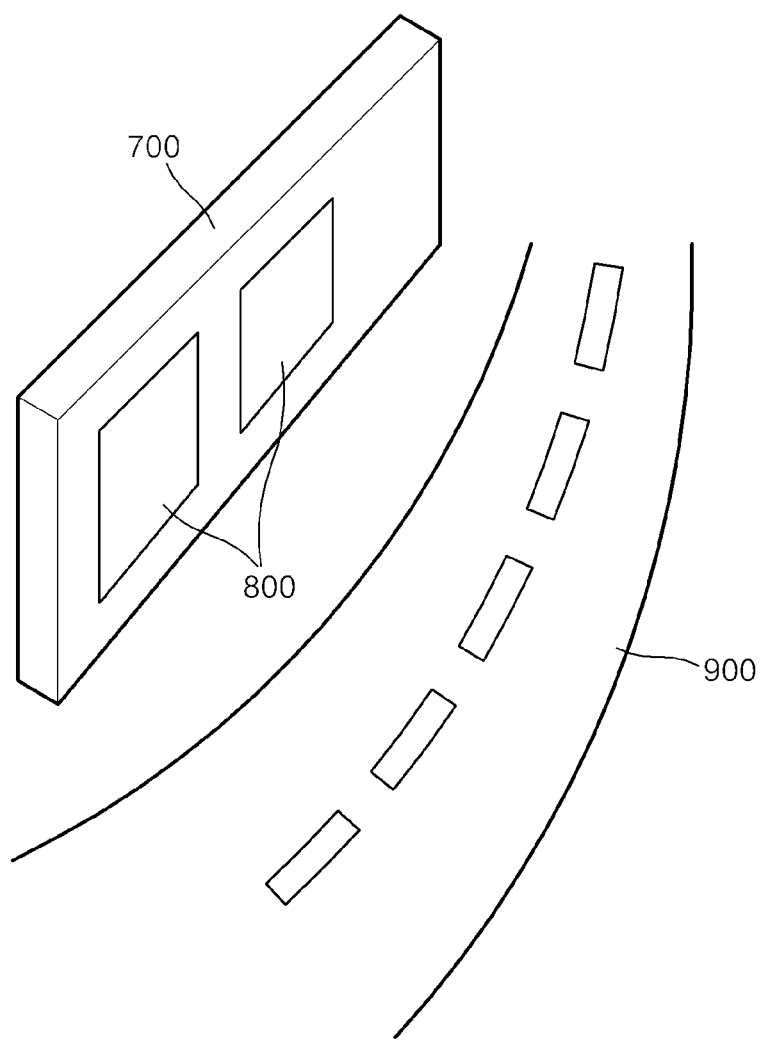
FIG. 12 illustrates a wall system including an electric energy generating device according to example embodiments.

FIG. 12 illustrates a wall system 700 including an electric energy generating device according to example embodiments.

Referring to FIG. 12, a wall system 700 may include one or more electric energy generating devices 800 according to example embodiments. The wall system 700 may be part of a structure adjacent to a road 900, for example a highway. The wall system 700 may be configured to harvest energy from sound waves due to the noise from vehicle traffic on the road 900. The sound waves may be converted to electrical energy using the electric energy generating device 800 and supplied to a power system (not shown).

While FIG. 12 illustrates the wall system 700 is adjacent to a road, example embodiments are not limited thereto. For example, the wall system 700 may be placed in other areas and/or noisy environments where energy can be harvested from sound waves due to noise. For example, the wall system 700 may be placed near a construction site, near a train station or railroad track, near an airport runway, near the stage or speakers at a concert venue, but example embodiments are not limited thereto.

As described above, according to example embodiments, an electric energy generating device may be manufactured in such a manner that a piezoelectric structure is deformed when an insulating film including a material having electret characteristics contacts the piezoelectric structure through an external mechanical force, thereby inducing a higher output voltage. Also, when textile substrates having flexible and stretchable characteristics are used as substrates, the textile substrates may respond sensitively to low-intensity input energy, such as external noise or vibration, and may thus efficiently generate electrical energy from the low-density input energy.

While some example embodiments have been particularly shown and described, it will be understood by one of ordinary skill in the art that variations in form and detail may be made therein without departing from the spirit and scope of the claims.

What is claimed is:

1. An electric energy generating device comprising:
   a first substrate over a second substrate,
      the first and second substrate spaced apart from each other and each including a conductive material;
   a piezoelectric structure on the first substrate,
      the piezoelectric structure including a material having piezoelectric characteristics; and
   an insulating film between the piezoelectric structure and the second substrate,
      the insulating film including a material having electret characteristics.

2. The electric energy generating device of claim 1, wherein,
   the insulating film is configured to contact and deform the piezoelectric structure when an external mechanical force is applied to the insulating film, and
   the piezoelectric structure is configured to generate electric energy when deformed.

3. The electric energy generating device of claim 1, wherein the insulating film comprises a material having semi-permanent polarization or semi-permanent surface charges.

4. The electric energy generating device of claim 3, wherein the insulating film comprises one of a polymer-based material and an inorganic material.

5. The electric energy generating device of claim 4, wherein the polymer-based material comprises at least one of fluoropolymers, polyethylene (PE), polypropylene (PP), polyethylene terephthalate (PET), polyimide (PI), polymethylmethacrylate (PMMA), polyvinlylidenefluoride (PVDF), ethylene vinyl acetate (EVA), cellular polypropylene, and porous polytetrafluoroethylene (PTFE).

6. The electric energy generating device of claim 4, wherein the inorganic material comprises at least one of a silicon oxide, a silicon nitride, an aluminum oxide, and a photorefractive material.

7. The electric energy generating device of claim 1, wherein
   the piezoelectric structure includes an n type semiconductor material, and
   a surface of the insulating film facing the piezoelectric structure comprises (−) surface charges.

8. The electric energy generating device of claim 1, wherein
   the piezoelectric structure includes a p type semiconductor material, and
   a surface of the insulating film facing the piezoelectric structure comprises (+) surface charges.

9. The electric energy generating device of claim 1, wherein the piezoelectric structure comprises one of:
   a piezoelectric material layer on the first substrate, and
   a plurality of piezoelectric nano wires on the first substrate.

10. The electric energy generating device of claim 9, wherein
    the plurality of piezoelectric nano wires are one of perpendicular to the first substrate and inclined to the first substrate.

11. The electric energy generating device of claim 9, wherein the plurality of piezoelectric nano wires include diameters that are one of
    uniform in a lengthwise direction of the nano wires and
    gradually changing in the lengthwise direction of the nano wires.

12. The electric energy generating device of claim 9, wherein the plurality of piezoelectric nano wires comprise one of ZnO, lead zirconium titanate (PZT), and $BaTiO_3$.

13. The electric energy generating device of claim 9, wherein the piezoelectric material layer comprises a polymer piezoelectric film.

14. The electric energy generating device of claim 13, wherein the polymer piezoelectric film comprises polyvinylidene fluoride (PVDF).

15. The electric energy generating device of claim 1, wherein each of the first and second substrates comprise a textile substrate.

16. The electric energy generating device of claim 15, wherein the textile substrate comprises:
    a non-conductive textile, and
    a conductive layer on the non-conductive textile.

17. The electric energy generating device of claim 15, wherein the textile substrate comprises:
    a conductive textile.

18. An electric energy generating device comprising:
    a piezoelectric structure including a material having piezoelectric characteristics,
       the piezoelectric structure being configured to generate electricity when deformed; and
    an insulating film configured to contact and deform the piezoelectric structure,
       the insulating film including a material having electret characteristics.

19. The electric energy generating device of claim 18, wherein the insulating film comprises a material having semi-permanent polarization or semi-permanent surface charges.

20. The electric energy generating device of claim 18, wherein
    the piezoelectric structure includes an n type semiconductor material, and a surface of the insulating film facing the piezoelectric structure comprises (−) surface charges.

21. The electric energy generating device of claim 18, wherein
    the piezoelectric structure includes a p type semiconductor material, and a surface of the insulating film facing the piezoelectric structure comprises (+) surface charges.

22. The electric energy generating device of claim 18, further comprising:
first and second substrates, each including a conductive material,
wherein the piezoelectric structure and the insulating film are between the first and second substrates.

23. The electric energy generating device of claim 22, wherein
the piezoelectric structure is on the first substrate, and
the insulating film is between the piezoelectric structure and the second substrate.

24. The electric energy generating device of claim 22, wherein each of the first and second substrates comprises a textile substrate.

25. The electric energy generating device of claim 22, wherein the piezoelectric structure comprises one of:
a piezoelectric material layer on the first substrate, and
a plurality of piezoelectric nano wires on the first substrate.

26. The electric energy generating device of claim 22, wherein
the insulating film comprises one of a polymer-based material and an inorganic material.

27. An electric energy generating device comprising:
a first substrate adjacent to a second substrate,
the first and second substrate apart from each other and each including a conductive material;
a first piezoelectric structure on one of the first and second substrates,
the first piezoelectric structure including a material having piezoelectric characteristics; and
an insulating film between the first piezoelectric structure and the other of the first and second substrates,
the insulating film including a material having electret characteristics.

28. The electric energy generating device of claim 27, wherein
the insulating film comprises at least one of a polymer-based material and an inorganic material.

29. The electric energy generating device of claim 27, wherein
the first piezoelectric structure includes one of nano wires, nano tubes, nano particles, nano belts, nano cones, micro wires, micro tubes, micro particles, micro belts, and micro cones.

30. The electric energy generating device of claim 27, wherein
the first piezoelectric structure comprises one of a piezoelectric material layer and a plurality of piezoelectric nano wires.

31. The electric energy generating device of claim 30, wherein
the first piezoelectric structure includes the plurality of piezoelectric nano wires, and
the plurality of piezoelectric nano wires include an aspect ratio of about 3 to about 10.

32. The electric energy generating device of claim 30, wherein
the plurality of piezoelectric nano wires are one of perpendicular and inclined to the one of the first and second substrates.

33. The electric energy generating device of claim 27, wherein
the first piezoelectric structure includes an n type semiconductor material, and a surface of the insulating film facing the piezoelectric structure comprises (−) surface charges.

34. The electric energy generating device of claim 27, wherein
the first piezoelectric structure includes a p type semiconductor material, and a surface of the insulating film facing the piezoelectric structure comprises (+) surface charges.

35. The electric energy generating device of claim 27, further comprising:
a second piezoelectric structure on one of the first substrate and the second substrate,
the second piezoelectric structure including a material having piezoelectric characteristics.

36. The electric energy generating device of claim 35, wherein
the first piezoelectric structure includes a plurality of first nano wires, and
the second piezoelectric structure includes a plurality of second nano wires.

37. The electric energy generating device of claim 36, wherein
the plurality of first nano wires and the plurality of second nano wires are on the first substrate;
a piezoelectric material of the first nano wires is different than a piezoelectric material of the second nano wires; and
the insulating layer is between the second substrate and both of the plurality of first nano wires and the plurality of second nano wires.

38. The electric energy generating device of claim 36, wherein
the plurality of first nano wires are on the first substrate;
the plurality of second nano wires are on the second substrate;
the plurality of first nano wires include one of an n-type semiconductor and a p-type semiconductor;
the plurality of second nano wires include the other of the n-type semiconductor and the p-type semiconductor.

39. The electric energy generating device of claim 38, further comprising:
a third piezoelectric structure on one of the first substrate and the second substrate,
the third piezoelectric structure including a material having piezoelectric characteristics.

40. The electric energy generating device of claim 27, wherein
the first piezoelectric structure is on the first substrate,
the insulating film surrounds the first substrate and the first piezoelectric structure, and
the second substrate surrounds the insulating film.

41. A phone comprising:
a housing;
a circuit in the housing;
a microphone connected to the circuit;
a speaker connected to the circuit; and
at least one electric energy generating device according to claim 27,
the at least one electric energy generating device electrically connected to the circuit.

42. A wall system comprising:
at least one electric energy generating device according to claim 27.

* * * * *